United States Patent [19]
Chu et al.

[11] Patent Number: 5,689,127
[45] Date of Patent: Nov. 18, 1997

[54] VERTICAL DOUBLE-GATE FIELD EFFECT TRANSISTOR

[75] Inventors: Jack Oon Chu, Astoria; Louis Lu-Chen Hsu, Fishkill; Jack Allan Mandelman, Stormville; Yuan-Chen Sun, Katonah; Yuan Taur, Bedford, all of N.Y.

[73] Assignee: International Business Machines Corporation, Armonk, N.Y.

[21] Appl. No.: 610,949

[22] Filed: Mar. 5, 1996

[51] Int. Cl.[6] .................... H01L 29/76; H01L 29/94
[52] U.S. Cl. .................... 257/329; 257/135; 257/263; 257/328
[58] Field of Search .................... 257/60, 135, 136, 257/263, 264, 265, 266, 267, 302, 328, 329, 330, 331, 332, 333, 334; 437/31, 45, 62, 44, 909, 915

[56] References Cited

U.S. PATENT DOCUMENTS

| | | | |
|---|---|---|---|
| 4,620,207 | 10/1986 | Calviello | 357/22 |
| 4,851,889 | 7/1989 | Matsuzaki | 357/23.4 |
| 4,859,623 | 8/1989 | Busta | 437/48 |
| 4,916,499 | 4/1990 | Kawai | 357/22 |
| 5,136,350 | 8/1992 | Itoh | 357/23.4 |
| 5,140,388 | 8/1992 | Bartelink | 357/23.4 |
| 5,283,456 | 2/1994 | Hsieh et al. | 257/347 |
| 5,296,403 | 3/1994 | Nishizawa et al. | 437/133 |
| 5,340,759 | 8/1994 | Hsieh et al. | 437/41 |
| 5,367,189 | 11/1994 | Nakamura | 257/508 |
| 5,391,895 | 2/1995 | Dreifus | 257/77 |

OTHER PUBLICATIONS

Hisamoto, et al., "A Fully Depleted Lean–channel Transistor(DELTA)—A novel vertical ultra thin SOI MOSFET"—, IEEE, 1989, pp. 34.5.1 – 34.5.4.

Takato, et al., "High Performance CMOS Surrounding Gate Transistor (SGT) for Ultra High Density LSIs", IEEE 1988.

Wong, et al., "Design and Performance Considerations for Sub–0.1um Double–Gate SOI MOSFET's", IEEE 1994, pp. 30.6.1 – 30.6.4.

Perera, et al., "Short–Channel Vertical NMOSFET's for High Density Fast SRAMs", IEEE 1994, pp. 34.6.1 – 34.6.4.

Mandelman, et al., "Body–Doping Considerations for High Performance 0.1-um SOI MOSFETS", IEEE, 1991, pp. 54 – 55.

*Primary Examiner*—Carl W. Whitehead, Jr.
*Attorney, Agent, or Firm*—Susan M. Murray

[57] ABSTRACT

A vertical double-gate field effect transistor includes a source layer, an epitaxial channel layer and a drain layer arranged in a stack on a bulk or SOI substrate. The gate oxide is thermally grown on the sides of the stack using differential oxidation rates to minimize input capacitance problems. The gate wraps around one end of the stack, while contacts are formed on a second end. An etch-stop layer embedded in the second end of the stack enables contact to be made directly to the channel layer.

9 Claims, 8 Drawing Sheets

VERTICAL DOUBLE-GATE FIELD EFFECT TRANSISTOR

FIELD OF THE INVENTION

This invention relates in general to field effect transistors and more specifically to vertical field effect transistors.

BACKGROUND OF THE INVENTION

Field effect transistors (FET's) are a fundamental building block in the field of integrated circuits. FET's can be classified into two basic structural types: horizontal and vertical. Horizontal, or lateral, FET's exhibit carrier flow from source to drain in a direction parallel (e.g. horizontal) to the plane of the substrate on which they are formed. Vertical FET's exhibit carrier flow from source to drain in a direction transverse to the plane of the substrate (e.g. vertical) on which they are formed.

While horizontal FET's are widely used and favored in the semiconductor industry because they lend themselves easily to integration, vertical FET's have a number of advantages over horizontal FET's. Because channel length for vertical FET's is not a function of the smallest feature size resolvable by state-of-the-art lithographic equipment and methods (e.g. on the order of 0.25 micrometers), vertical FET's can be made with a shorter channel length (e.g. on the order of 0.1 micrometers) than horizontal FET's, thus providing vertical FET's the capability to switch faster and as well as a higher power handling capacity than horizontal FET's. There is also the potential for greater packing density with vertical FET's.

FET structures may include a single gate (e.g. for forming a single channel) or a pair of gates (e.g. for forming a pair of channels), with double-gate versions providing an advantage of an increased current carrying capacity (e.g. typically greater than twofold over the single-gate versions). A number of horizontal double-gate FET structures, particularly in the Silicon-On-Insulator (SOI) area, have been proposed. Such structures typically require a bottom gate at the back of the substrate in addition to the conventional top gate. Fabrication of such structures is difficult because the top and bottom gate must be aligned to within tolerances beyond the accuracy of state of the art lithographical equipment and methods, and because self-aligning techniques are frustrated by the layers between the top and bottom gates.

In addition, it is desirable to have a means for electrically contacting the body of the transistor (e.g. where the channel is formed). Such contact is critical for avoiding unwanted parasitic effects created by a body having a floating potential; floating body effects can be particularly problematical for SOI transistors. However, proposed horizontal double-gate FET schemes generally lack any means for contacting to the body of the transistor.

What is needed is a double-gate FET which solves the above mentioned problems.

SUMMARY OF THE INVENTION

It is an object of the present invention to provide a vertical double-gate transistor structure which has a high current carrying capacity.

It is a further object of the present invention to provide a vertical double-gate transistor structure having an electrically conductive connection to the body wherein the channel is formed.

It is a further object still to provide a vertical double-gate transistor structure capable of being manufactured using known state-of-the-art fabrication techniques.

The present invention is directed to a vertical double-gate transistor and a method for making the same. In one embodiment of the invention, the transistor includes a substrate, over which is stacked source, channel, drain and dielectric layers. On a first end of the transistor a gate oxide and conductive gate are wrapped around the top and sides of the stacked layers. Electrical contacts may be provided on a second end of the transistor. In one embodiment the first end includes a plurality of fingers around which the gate oxide and conductive gate are wrapped.

In another aspect of the invention, a method for fabricating a vertical double-gate transistor is provided. The method includes the steps of obtaining a semiconductor substrate; forming on the semiconductor substrate a source layer; forming on the source layer a channel layer; forming over a portion of the channel layer at a first end of the channel layer an etch-stop layer; forming over the channel layer and the etch stop layer a drain layer; forming over the drain layer a first dielectric layer; forming over a portion of the source, channel and drain layers a gate dielectric and a conductive gate, thus forming an insulated stack having a first end including the etch stop and a second end including the gate oxide and conductive gate; forming over the conductive gate a conformal dielectric layer; removing a portion of the drain layer at the second end of the insulated stack to expose the etch stop layer, and removing portions of the source and channel layers unprotected by the etch stop layer, thereby forming a contact plateau in each of the source, channel and drain layers; forming sidewall spacers along the sides of the contact plateaus; and forming vertical contacts connected to each of the source, channel and drain contact plateaus.

BRIEF DESCRIPTION OF THE DRAWINGS

The subject matter which is regarded as the invention is particularly pointed out and distinctly claimed in the concluding portion of the specification. The invention, however, may best be understood by reference to the following detailed description of the preferred embodiments and the accompanying drawings in which:

DETAILED DESCRIPTION OF THE PREFERRED EMBODIMENT

Figure 1A:
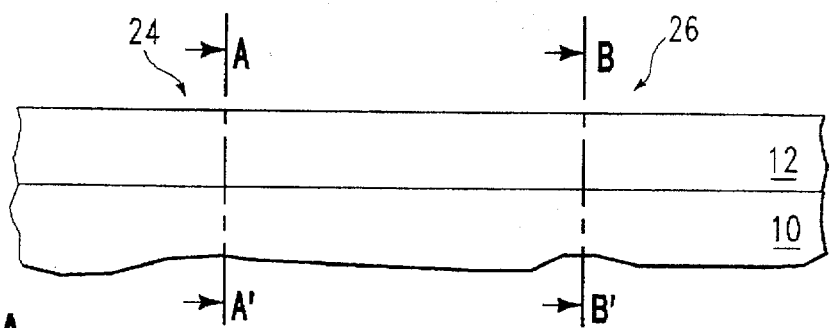
FIGS. 1A through 1I depict the fabrication steps in a preferred embodiment of the method of the present invention for forming a vertical double-gate field effect transistor.

Referring now to the drawings, the device in this illustrative embodiment of the invention is a CMOS device, particularly an enhancement mode NMOS FET. As will be appreciated by those having ordinary skill in the art, a similar PMOS FET can be fabricated in accordance with the teachings of the invention by using p-type dopants in place of n-type dopants and vice versa.

Figure 2A:
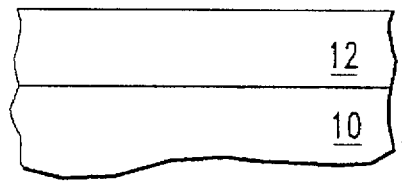
FIGS. 2A through 2I depict the fabrication steps in a preferred embodiment of the method of the present invention as viewed from cross-section A—A' shown in FIG. 1A and correspond to the respective like-numbered FIGS. 1 and 3.
Figure 3A:
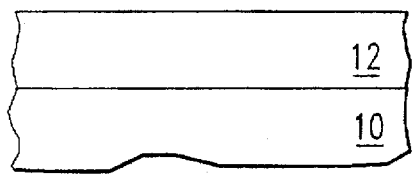
FIGS. 3A through 3I depict the fabrication steps in a preferred embodiment of the method of the present invention as viewed from cross-section B—B' shown in FIG. 1A and correspond to the respective like-numbered FIGS. 2 and 3.

Referring to FIG. 1A there is shown a cross-sectional view of a semiconductor substrate 10. FIGS. 2A and 3A show the same device from corresponding respective cross-section A—A' at a first end 24 and cross-section B—B' at a second end 26 which correspondence to FIG. 1 carries through the remainder of FIGS. 2 and 3 (e.g. FIG. 1B corresponds to FIGS. 2B and 3B at cross-sections A—A' and B—B' respectively etc). The substrate 10 may be silicon, gallium arsenide, or another semiconductor material. The substrate 10 may be, for example, of the bulk or SOI type. If the substrate 10 is a bulk substrate, a p-type well (not shown) may be formed in the substrate 10. Next, formed over the substrate 10 is an n-type source layer 12, preferably an n+ type source layer, for reasons which will be explained below. The source layer 12 may be formed by a conventional ion implantation of the substrate 10 or by an epitaxial method known in the art.

Figure 1B:
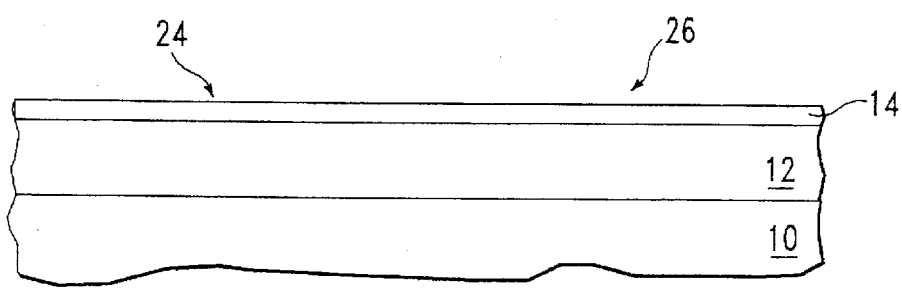
Figure 2B:
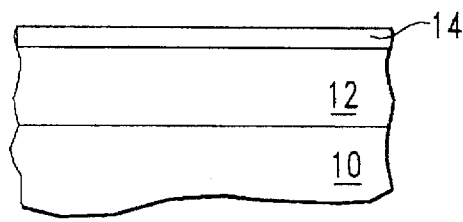
Figure 3B:
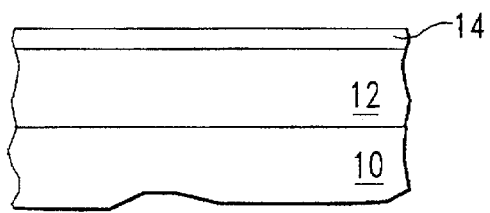

With reference to FIGS. 1B, 2B and 3B, a p-type channel layer 14 is formed, preferably by a low-temperature epitaxial (LTE) method. For example, a suitable LTE method is disclosed in "Low-Temperature Silicon Epitaxy by Ultra-high Vacuum/Chemical Vapor Deposition", by B. S. Meyerson, *Appl. Phys. Lett.* 48 (12), Mar. 24, 1986, pp. 797–799. LTE methods are preferred to form the channel layer 14 in order to avoid excessive out-diffusion from the n-type source layer 12, thereby permitting greater control over channel length than is afforded by other methods. The thickness of the channel layer 14 is preferably on the order of 1000 Å. In order to grow a high quality channel layer 14, it is preferable to cause the source 12 to be amorphized and then recrystallized early in the LTE process. The doping provided to the channel layer 14 by the LTE process is preferably in the range of $1 \times 10^{16}$ atoms/cm$^3$ to $3 \times 10^{18}$ atoms/cm$^3$, depending on the desired threshold voltage.

Figure 1C:
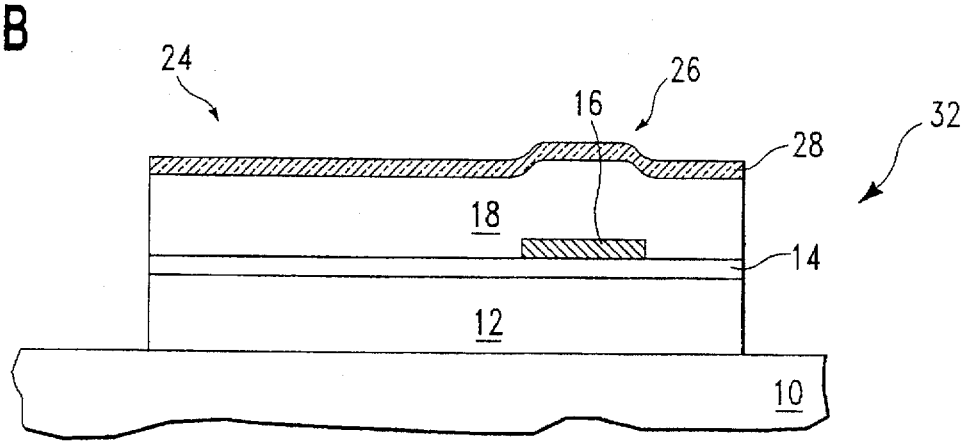
Figure 2C:
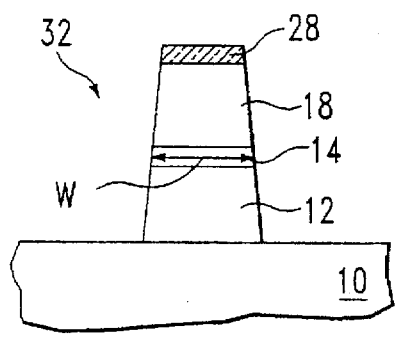
Figure 3C:
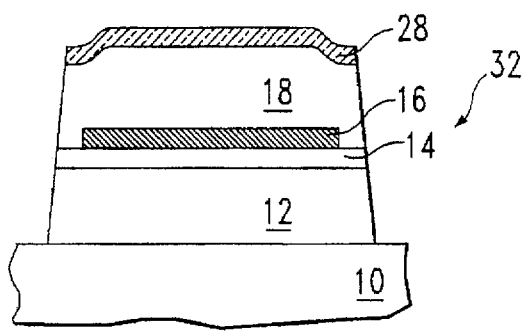

With reference to FIGS. 1C, 2C and 3C, an etch-stop layer 16 is formed over a portion of the second end 26. The size and location of the etch-stop layer 16 may be defined lithographically, and should be dimensioned and toleranced to ensure coverage over an area of the channel layer 14 desired for forming thereon a body contact. The etch-stop layer 16 may be approximately 200 Å to 500 Å thick for eventual removal by an etchant having a selectivity ratio no less than 10:1 over the channel layer 14, and is preferably a dielectric and more preferably an oxide.

With continued reference to FIGS. 1C, 2C and 3C, an n-type drain layer 18, preferably an n+ type drain layer, is formed over the channel layer 14 and the etch-stop layer 16. The drain layer 18 is preferably formed by chemical vapor deposition (CVD) of polycrystalline silicon, followed by diffusion annealing. The diffusion annealing may comprise heating in an inert ambient environment at a temperature on the order of 800° C. to 1050° C., for example, rapid thermal annealing at 950° C. The combination of CVD followed by diffusion annealing allows for limited out-diffusion from the drain layer 18 into channel layer 14 and recrystallization of a portion of the polysilicon drain layer 18 near the channel layer 14 without losing control over the effective channel length, $L_{eff}$ (e.g. approximately equal to thickness of channel layer 14 less the out-diffusion exhibited by the drain layer 18 and the source layer 12).

Figure 6:
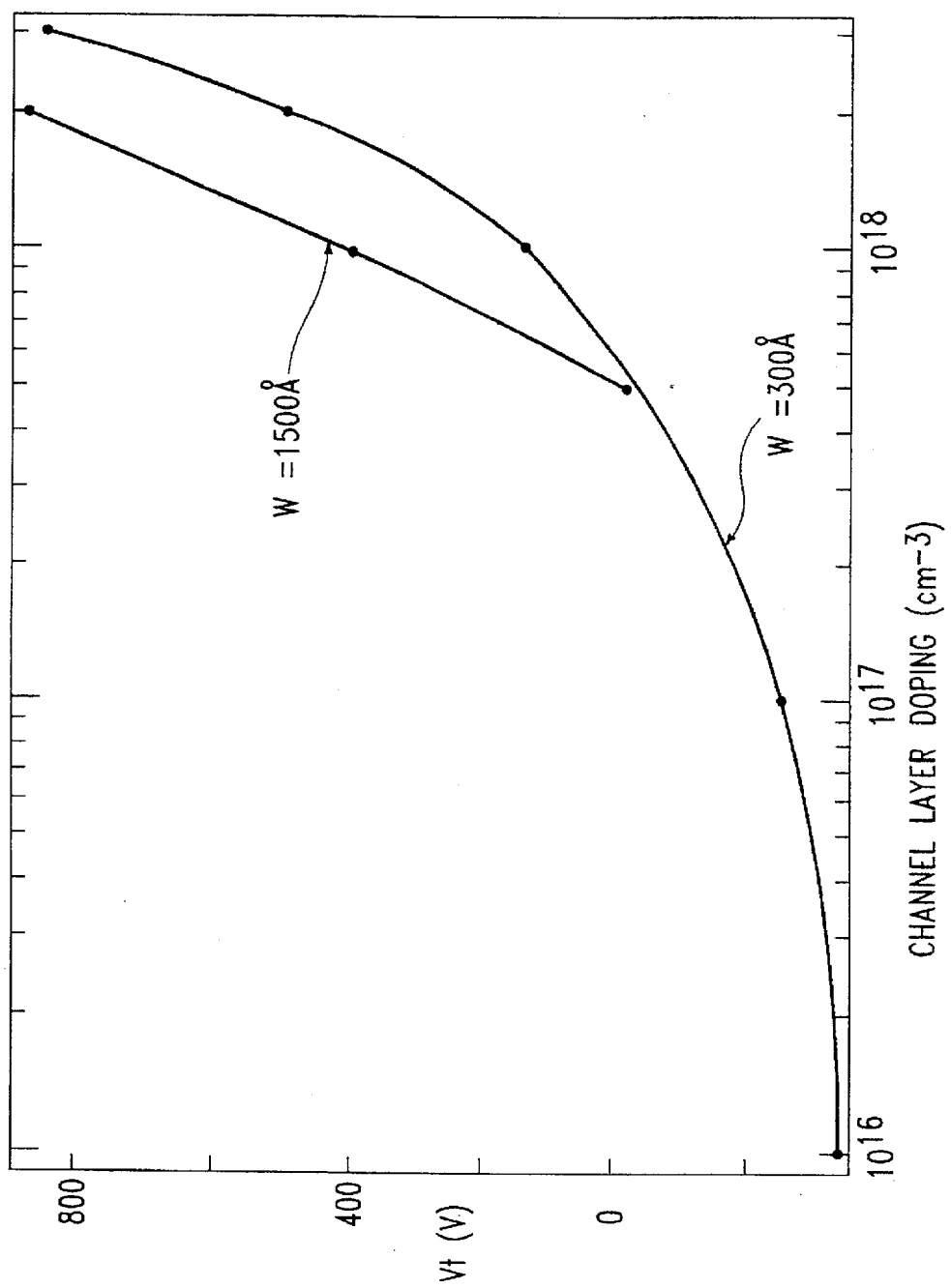
FIG. 6 is a graph depicting threshold voltage as a function of channel layer doping and mesa width W.

With continued reference to FIGS. 1C, 2C and 3C, a passivation cap 28 is formed over the drain layer 18. The passivation cap 28 is preferably a dielectric formed by CVD from tetraethylorthosilicate (TEOS) at approximately 700° C. Next, the substrate 10 is patterned to form a transistor stack 32. The patterning controls the desired width W of the channel layer 14 (hereinafter referred to as the mesa width W; see FIG. 2C for identification of W) on the first side 24 of the transistor stack 32. For a completed transistor having an effective channel length, $L_{eff}$, of approximately 1000 Å to operate in a fully-depleted mode (e.g. with merging depletion regions), the mesa width W should be preferably on the order of 300 Å to 1000 Å. Larger mesa widths may result in less than full-depletion or a threshold voltage $V_{th}$ which is extremely sensitive to the doping concentration of the channel layer 14. FIG. 6 shows the simulated sensitivity of the threshold voltage to channel layer doping for W=300 Å and W=1500 Å. It is evident from the graph that for doping below about $5 \times 10^{17}$/cm$^3$, a transistor having a mesa width W of 1500 Å punches through, resulting in loss of gate control and excessively low threshold voltage. In contrast, a relatively narrow mesa width W, such as 300 Å, provides the ability to lightly dope the channel layer 14, affording such advantages as high carrier mobilities and thus higher current carrying capacity, without sacrificing gate control. Mesa widths in the range of 300 Å to 1000 Å may be achieved by employing known sidewall image transfer techniques.

Figure 1D:
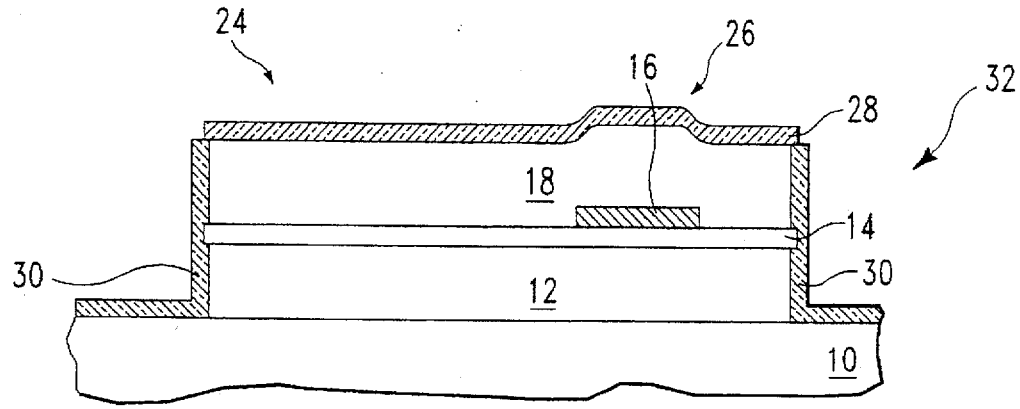
Figure 2D:
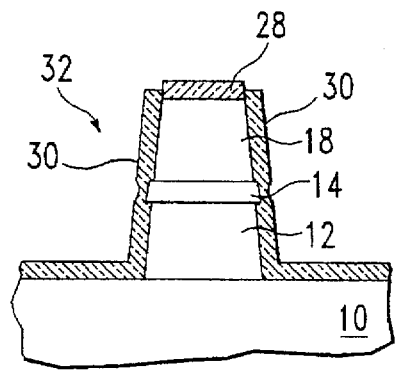
Figure 3D:
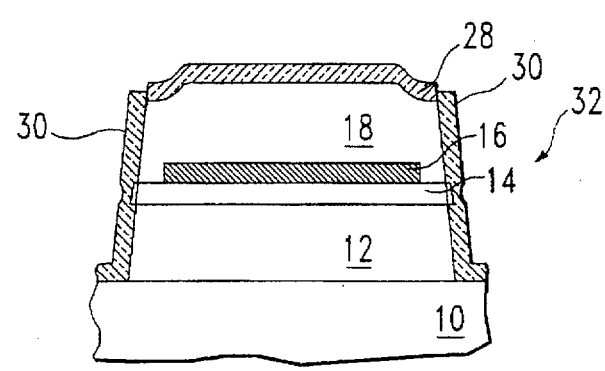

With reference to FIGS. 1D, 2D and 3D, a vertical gate oxide 30 is grown along the sides of the transistor stack 32, alongside each of the source layer 12, channel layer 14 and drain layer 18. The portions of the gate oxide 30 overlapping the source layer 12 and drain layer 18 can be made thicker than the portion of the gate oxide 30 overlapping the channel layer 14, to provide a smaller capacitance value relative to that provided by the oxide overlapping the channel layer 14, thus minimizing the input capacitance created by the gate oxide overlapping the source layer 12 and the drain layer 18. The oxidation conditions and doping of the source layer 12 and drain layer 18 may be selected in order to exploit variations in oxidation rates with the doping concentration of a semiconductor. For example, the oxidation rate of an n+ polysilicon layer ($1.5 \times 10^{20}$/cm$^3$) may be up to approximately 5 times as fast as the oxidation rate of a p- layer ($1 \times 10^{16}$/cm$^3$). If the drain layer 18 and source layer 12 are each doped at an n+ level while the epitaxial channel layer 14 is p-, the thickness of the portions of the gate oxide 30 which overlap the source layer 12 and the drain layer 18 may be approximately 5 times the thickness of the portion of the gate oxide which overlaps the channel layer 14.

Figure 1E:
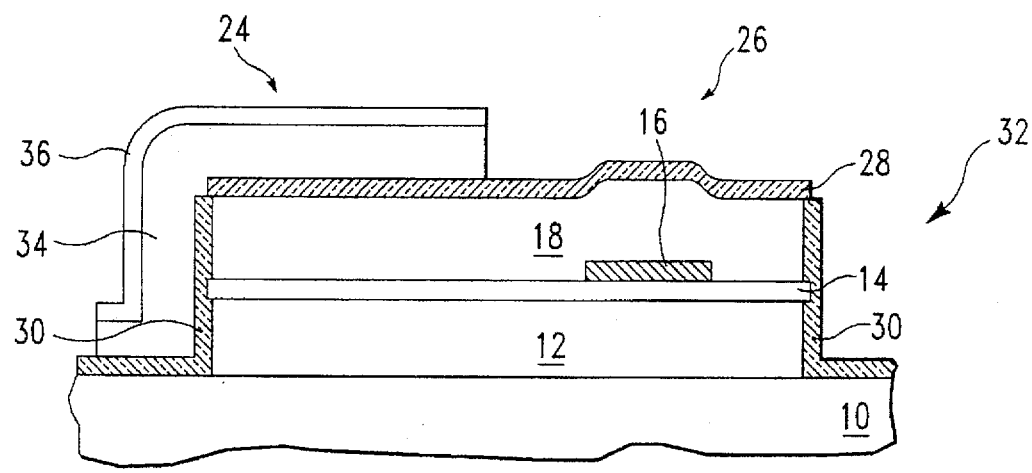
Figure 2E:
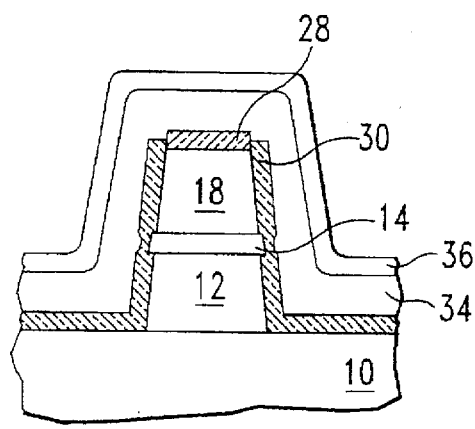
Figure 3E:
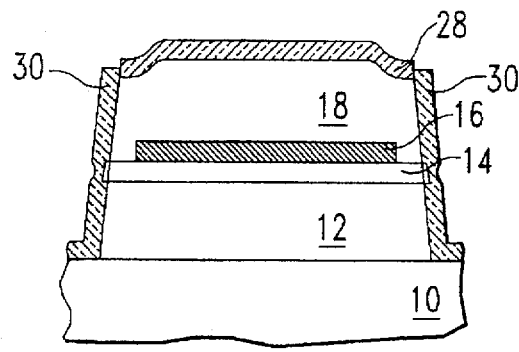

With reference to FIGS. 1E, 2E and 3E, a conformal gate 34 and gate cap 36 can be formed over and wrapped around the sides of the transistor stack 32, forming a contiguous structure. The gate 34 must be conductive, is preferably polycrystalline silicon or tungsten, more preferably n+ polysilicon, or p+ polysilicon if a high threshold voltage is desired for a lower off-current, and may be formed by known CVD methods. The gate cap 36 should be a dielectric material and may be grown or deposited by known methods. The portions of the gate 34 and the gate cap 36 covering the second end 26 of the transistor stack 32 may then be removed such that the gate 34 and the gate cap 36 cover the exposed edges of only the first end 24 of the transistor stack 32. The removal may be achieved by applying a photosensitive material, patterning the photosensitive material such that the second end 26 of the transistor stack 32 is exposed, and etching the transistor stack 32 until the passivation cap 28 at the second end 26 is exposed. Forming the gate 34 in this manner avoids the alignment problems referred to hereinabove which problems are typically associated with horizontal double-gate transistors.

Figure 1F:
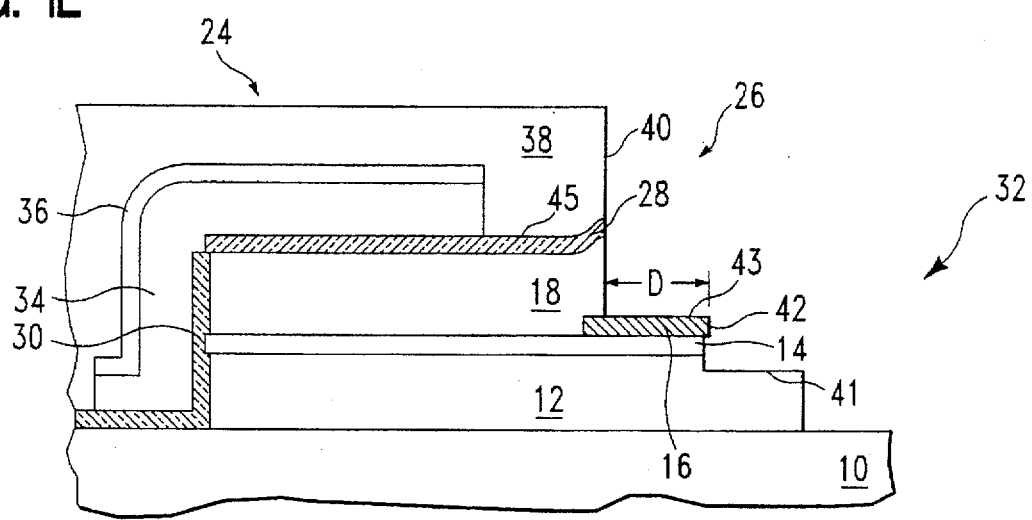
Figure 2F:
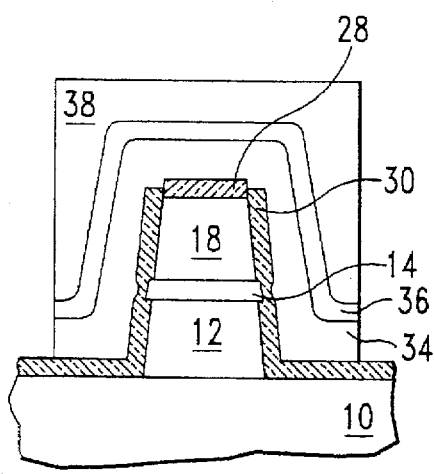
Figure 3F:
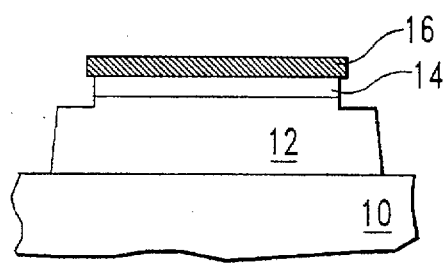

With reference to FIGS. 1F, 2F and 3F, another photosensitive layer 38 may be applied and patterned. The patterning of photosensitive layer 38 aligns inside edge 40 cooperatively with etch-stop layer 16 as shown in FIG. 1F. More particularly, a line extended from inside edge 40 would intersect etch-stop layer 16 a distance D from outside edge 42 of the etch-stop layer 16, the distance D roughly approximating the size of an electrical contact to be made to the channel layer 14. After patterning, the transistor stack 32 may be subjected to etching to remove portions of the source layer 12, the channel layer 14 and the drain layer 18 at the second end 26. A suitable reactive ion type etchant for an oxide etch-stop layer 16 should be selective to both oxide and photoresist, for example, HBr, or alternatively, HCl+Cl+$O_2$+$N_2$. As shown in FIGS. 1F, 2F and 3F, the portions of the drain layer 18 at the second end 26 which are not protected by the photosensitive layer 38 are completely removed. Etching is continued until the source layer 12 is exposed, but a portion of the channel layer 14 remains, having been protected by the etch-stop layer 16. After etching, plateaus 41, 43 and 45 have been formed for making contact respectively to the source layer 12, the channel layer 14 and the drain layer 18.

Figure 1G:
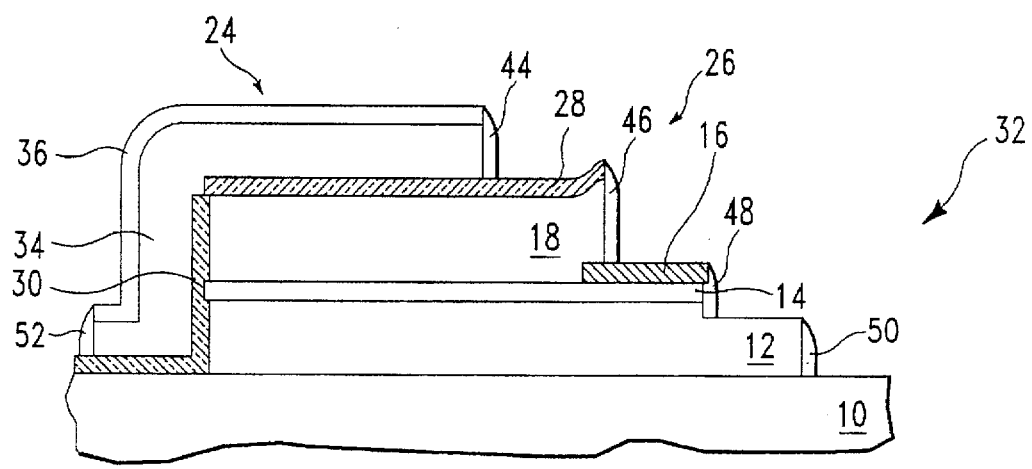
Figure 2G:
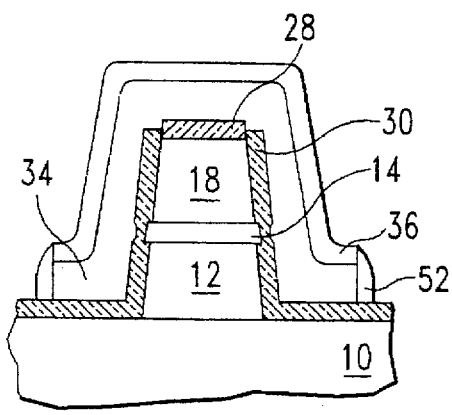
Figure 3G:
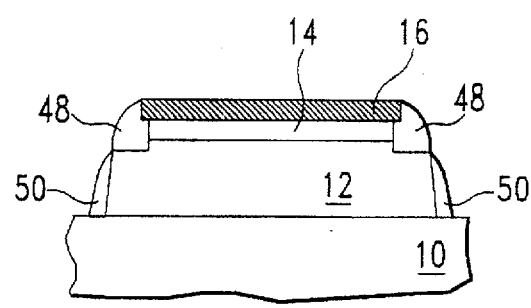

With reference to FIGS. 1G, 2G and 3G, the photosensitive layer 38 may be stripped from the transistor stack 32, and insulating sidewall spacers may be formed on exposed edges of the transistor stack 32. More particularly, sidewall spacers 44/52 have been formed along the exposed edges of the gate 34/cap 36. Similarly, sidewall spacers 46, 48 and 50 are formed respectively along the drain layer 18, the channel layer 14 and the source layer 12. The sidewall spacers 44, 46, 48, 50 and 52 may comprise nitride, formed, for example, by CVD followed by anisotropic etching. The use of nitride as the sidewall spacer material allows for a borderless contact scheme thus providing the advantage of more generous tolerances for placing contacts. However, if it is desired to apply silicide to the active regions to enhance the conductivity of the diffusion regions (e.g. source layer 12 and drain layer 18) to the conductive contacts to be formed (not shown), the sidewall spacers should be of a dielectric material rather than silicon nitride, to avoid shorting between layers.

Figure 1H:
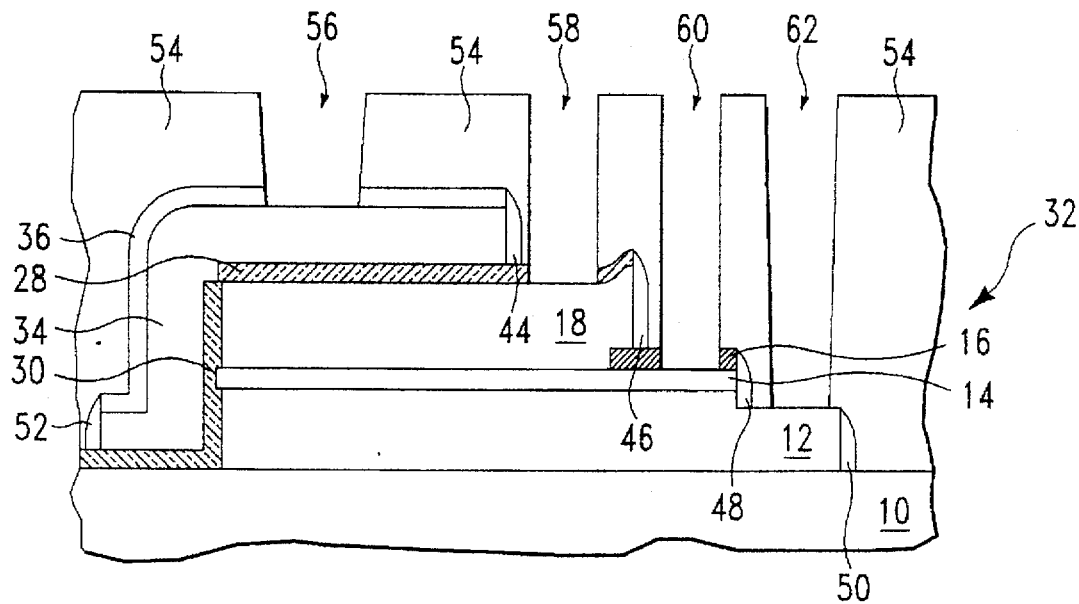
Figure 2H:
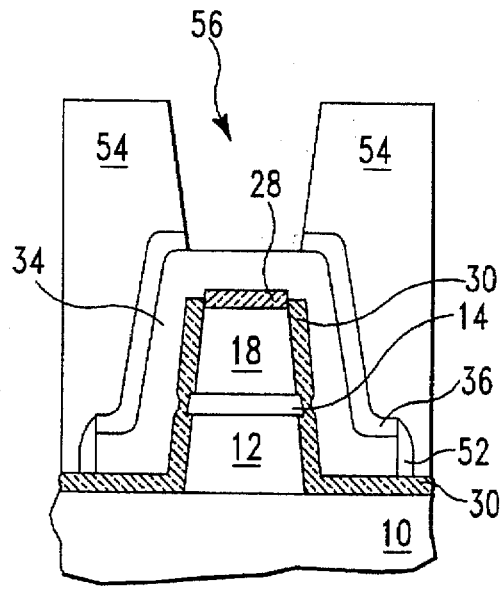
Figure 3H:
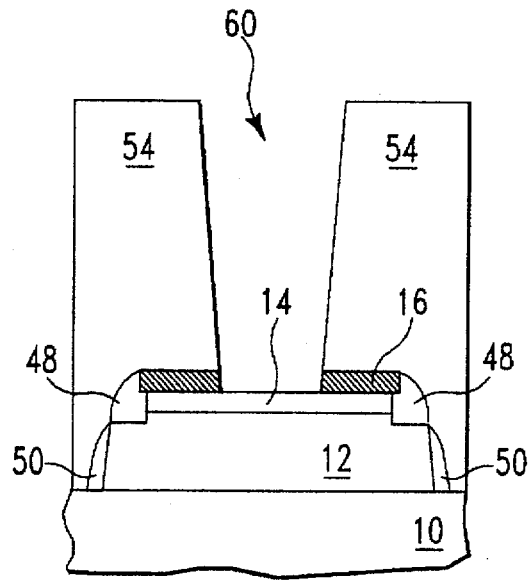

With reference to FIGS. 1H, 2H and 3H, the entire transistor stack 32 is encapsulated in a dielectric material 54, preferably silicon dioxide, and patterned. Openings 56, 58, 60, 62 for contact studs are etched through the encapsulating dielectric material 54. Opening 58 extends through both the encapsulating dielectric 54 and the passivation cap 28, thereby exposing and permitting contact to the drain layer 18. Opening 60 extends through both the encapsulating dielectric material 54 and the etch-stop layer 16, thereby exposing and permitting direct contact to the channel layer 14 (e.g. body contact).

Figure 1I:
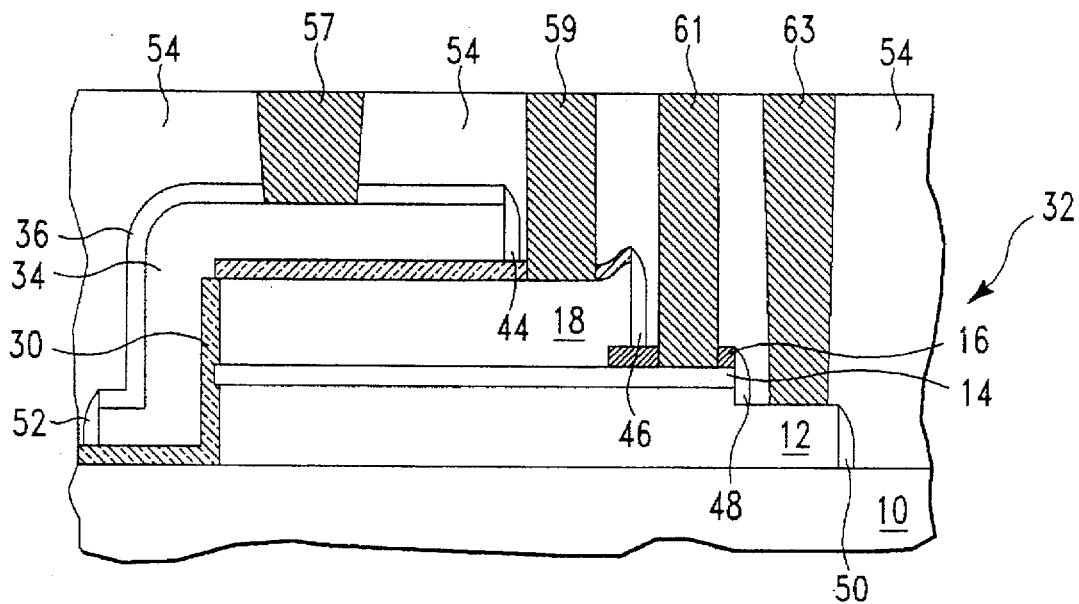
Figure 2I:
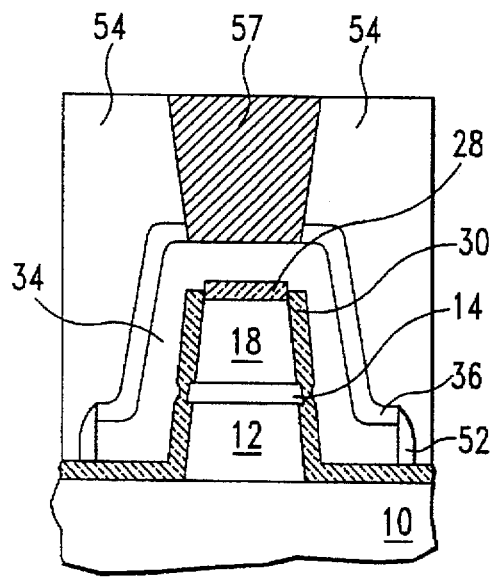
Figure 3I:
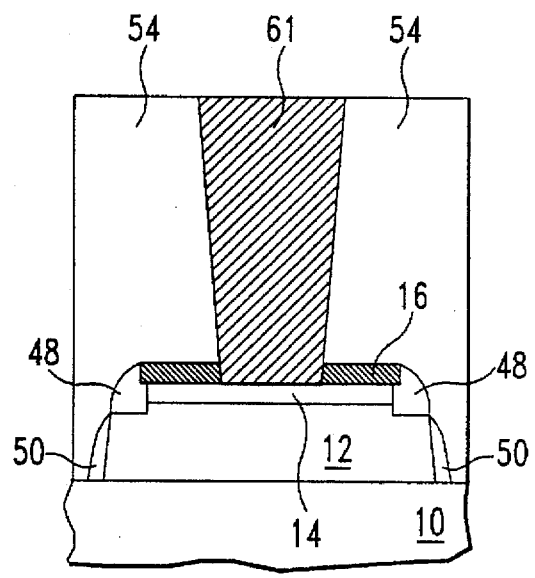

With reference to FIGS. 1I, 2I and 3I, electrically conductive contact studs 57, 59, 61 and 63 are formed by CVD of a conductive material such as tungsten, as is known in the art.

Figure 4:
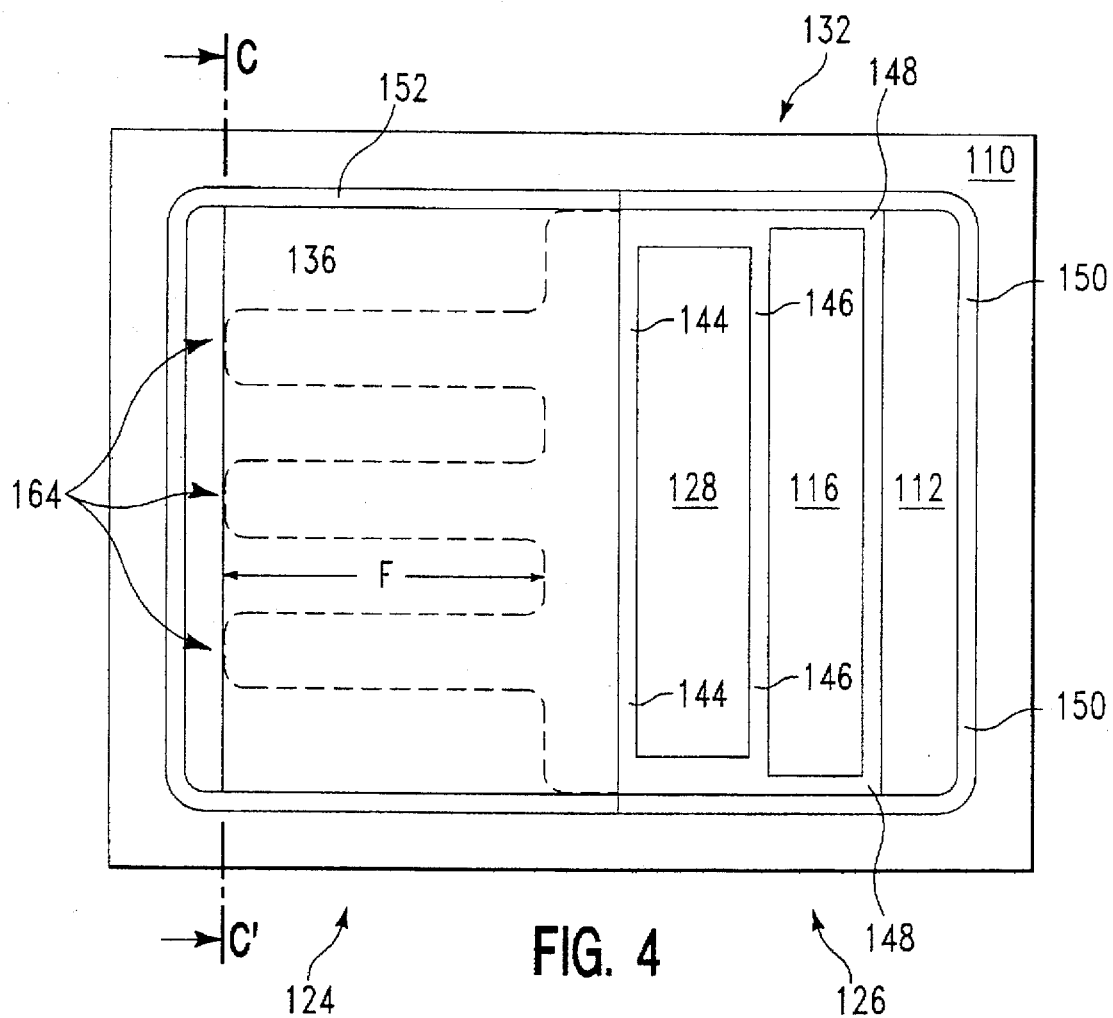
FIG. 4 is a top view of another preferred embodiment of the present invention.

FIG. 4 depicts a top view of another preferred embodiment of the present invention, in which like reference numerals indicate like features. The structure shown in FIG. 4 can be formed by the steps described above up through the description referring to FIGS. 1G, 2G and 3G (e.g. just prior to encapsulation and formation of contact studs 57, 59, 61 and 63). The transistor stack 132 shown in FIG. 4 includes a contact end 126, analogous to the second end 26 of the transistor stack 32 shown in FIGS. 1G, 2G and 3G, and an active end 124 analogous to the first end 24 shown in FIGS. 1G, 2G and 3G. The active end 124, however, is characterized by a plurality of fingers 164 each of which is analogous to the first end 24 of the transistor stack 32 shown in FIGS. 1G, 2G and 3G and which are joined at the contact end 126 in order to share contacts. The structure shown in FIG. 4 provides additional current carrying capacity in a dense layout. An exemplary vertical transistor made in accordance with the present invention may have for each of four fingers, a channel length of 1000 Å and a mesa width W of 300 Å, and a finger length of approximately 2000 Å.

Increasing finger length F can further increase the current carrying capacity of the transistor stack 132, but may be accompanied by undesirable increases in propagation delay. An alternate embodiment provides for an additional set of contacts by making the structure 132 symmetric about the line C—C' shown in FIG. 4, thus effectively doubling finger length F without increasing propagation delay. Such a technique could also be applied to single-finger versions of the invention, but would be less space efficient.

Figure 5:
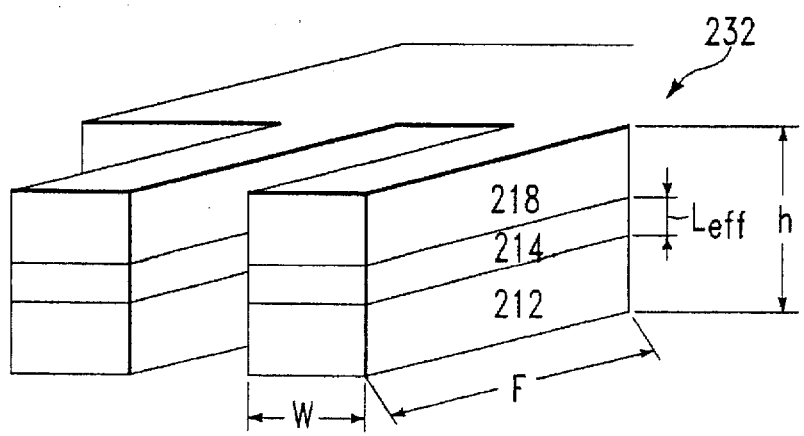
FIG. 5 is a simplified perspective view of a portion of the structure shown in FIG. 4.

The above description includes specific exemplary dimensions for the preferred embodiment. However, the invention can be more broadly described by roughly approximating the relative relationships of the important dimensions. Depicted in FIG. 5 is a simplified representation of a multi-fingered transistor stack 232, for purposes of illustrating important dimensions. Shown in FIG. 5 is $L_{eff}$ or effective channel length, determined by the thickness of the channel layer 214, and the overall height, h, of the transistor stack 232, which is characterized by the sum of the thicknesses of the source layer 212, the channel layer 214 and the drain layer 218. Also shown are the mesa width W, and finger length F, as identified. Table 1 below gives approximate favored ranges of dimensions and/or relationships between the identified dimensions:

| | | | | |
|---|---|---|---|---|
| 500Å | </= | $L_{eff}$ | </= | 1000Å |
| 300Å | </= | W | </= | 1500Å |
| 3W | </= | F | </= | 10W (Note: can be doubled as noted above) |
| | | h | </= | 10W. |

Various advantages over the prior art are provided by the invention herein described. Importantly, the invention provides a vertical transistor with direct contact to the channel layer 14 (e.g. body), an important characteristic for avoiding floating body effects in SOI devices. The invention further provides a transistor capable of carrying 2X or more that of a single-gate planar transistor, with increasing current as mesa width W is decreased, due to channel depletion effects. Short channel effects, with respect to $L_{eff}$, are suppressed as mesa width W is decreased and the channel approaches full depletion. Furthermore, the alignment problems normally associated with double-gate transistors are avoided by the use of a wrap-around gate 34.

While the invention has been particularly shown and described with reference to preferred embodiments thereof, it will be understood by those skilled in the art that various other changes in form and detail may be made therein without departing from the spirit and scope of the invention.

We claim:

1. A vertical double-gate field effect transistor comprising:
   a substrate;
   a source layer disposed on the substrate, the source layer having a first peripheral edge;
   a channel layer disposed on the source layer, the channel layer having a thickness approximately defining a channel length of the transistor, the channel layer further having a second peripheral edge;

a drain layer disposed on the channel layer, the drain layer having a third peripheral edge;

a top dielectric layer disposed on the drain layer, having a fourth peripheral edge substantially coincident the first, second and third peripheral edges;

a vertical gate dielectric layer surrounding a portion of the source, channel and drain layers and in contact with the portion of the source, channel and drain layers at the respective first, second and third peripheral edges; and a conductive gate surrounding and in contact with the vertical gate dielectric layer and the top dielectric layer.

2. The structure as recited in claim 1 wherein the source, channel and drain layers are characterized by a common length and a common width and wherein the common length is substantially larger than the common width.

3. The structure as recited in claim 1 wherein the gate dielectric comprises oxide.

4. The structure as recited in claim 1 wherein the gate dielectric has associated with it a substantially lower capacitance adjacent the source and drain layers than at the channel layer.

5. The structure as recited in claim 1 wherein the gate dielectric is substantially thicker adjacent the source and drain layers than at the channel layer.

6. The structure as recited in claim 1 wherein the conductive gate is selected from the group comprising polysilicon and tungsten.

7. The structure as recited in claim 1 further comprising:

a gate contact connected to the conductive gate;

a body contact connected to the channel layer;

a source contact connected to the source layer; and a drain contact connected to the drain layer.

8. The structure as recited in claim 7 wherein the body contact, source contact and drain contact are formed on a first end of the transistor and wherein a second end of the transistor corresponding to the portion of the source layer, channel layer and drain layers in contact with the conductive gate comprises a plurality of fingers.

9. The structure as recited in claim 7 wherein the transistor operates in a fully-depleted mode.

* * * * *